(12) United States Patent
Liaw (10) Patent No.: US 10,916,551 B2
(45) Date of Patent: Feb. 9, 2021

(54) MEMORY CELL STRUCTURE

(71) Applicant: Taiwan Semiconductor Manufacturing Co., Ltd., Hsinchu (TW)

(72) Inventor: Jhon Jhy Liaw, Hsinchu County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/665,095

(22) Filed: Oct. 28, 2019

(65) Prior Publication Data

US 2020/0058657 A1 Feb. 20, 2020

Related U.S. Application Data

(63) Continuation of application No. 15/338,907, filed on Oct. 31, 2016, now Pat. No. 10,461,086.

(51) Int. Cl.
| | | |
|---|---|---|
| *H01L 27/11* | (2006.01) | |
| *H01L 23/522* | (2006.01) | |
| *H01L 23/528* | (2006.01) | |
| *H01L 27/02* | (2006.01) | |
| *G11C 11/412* | (2006.01) | |

(52) U.S. Cl.
CPC ........ *H01L 27/1104* (2013.01); *H01L 23/528* (2013.01); *H01L 23/5226* (2013.01); *H01L 27/0207* (2013.01); *G11C 11/412* (2013.01)

(58) Field of Classification Search
CPC .................................................. H01L 27/1104
See application file for complete search history.

(56) References Cited

U.S. PATENT DOCUMENTS

| | | |
|---|---|---|
| 6,535,453 B2 | 3/2003 | Nii et al. |
| 6,590,802 B2 | 7/2003 | Nii et al. |
| 8,605,523 B2 | 12/2013 | Tao et al. |
| 8,630,132 B2 | 1/2014 | Cheng et al. |
| 8,760,948 B2 | 6/2014 | Tao et al. |
| 2014/0032871 A1 | 1/2014 | Hsu et al. |
| 2014/0153321 A1 | 6/2014 | Liaw |
| 2014/0153345 A1 | 6/2014 | Kim et al. |
| 2014/0177352 A1 | 6/2014 | Lum |
| 2014/0233330 A1 | 8/2014 | Ko et al. |
| 2014/0241077 A1 | 8/2014 | Katoch et al. |
| 2014/0269114 A1 | 9/2014 | Yang et al. |
| 2016/0307882 A1* | 10/2016 | Chen .................. H01L 27/0207 |

* cited by examiner

*Primary Examiner* — Moazzam Hossain
*Assistant Examiner* — Hajar Kolahdouzan
(74) *Attorney, Agent, or Firm* — Haynes and Boone, LLP (57) ABSTRACT

Provided is a method of forming a memory cell including a rectangular shaped via for at least one Vss node connection. In some embodiments, the rectangular shaped via has a length/width of greater than 1.5. The rectangular shaped via may be disposed on the Via0 and/or Via1 layer interfacing a first metal layer (e.g., M1). The memory cell may also include circular/square shaped vias having a length/width of between approximately 0.8 and 1.2. The circular/square shaped vias may be coplanar with the rectangular shaped vias.

20 Claims, 11 Drawing Sheets

MEMORY CELL STRUCTURE

CROSS-REFERENCE TO RELATED APPLICATIONS

This application is a continuation application of U.S. patent application Ser. No. 15/338,907, filed Oct. 31, 2016, which will issue as U.S. Pat. No. 10,461,086, which hereby incorporated by reference in its entirety.

BACKGROUND

The present application relates generally to the field of semiconductor devices, and more particularly, to integrated circuits and methods for forming the integrated circuits.

Memory circuits have been used in various applications. Conventionally, memory circuits can include DRAM, SRAM, or non-volatile memory circuits such as ROM. The memory circuits typically include a plurality of memory cells arranged in arrays. The memory cells are typically accessed through a bit line (BL) (associated with a column of the array) and a word line (WL) (associated with a row of the array). The memory cell at the intersection of the specified BL and WL is the addressed cell. An exemplary SRAM memory cell is a 6-transistor (6-T) static memory cell. The 6-T SRAM memory cell is coupled with other cells in the array and peripheral circuitry using a bit line (BL), a complement bit line (bit line bar) (BLB), and a word line (WL). Four of the six transistors form two cross-coupled inverters for storing a datum representing "0" or "1". The remaining two transistors serve as access transistors to control the access of the datum stored within the memory cell. Various other memory cell designs are also used in a variety of applications. Configuration of the memory cell, BL, and WL can affect performance and a suitable configuration for performance and spacing is desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Figure 8:
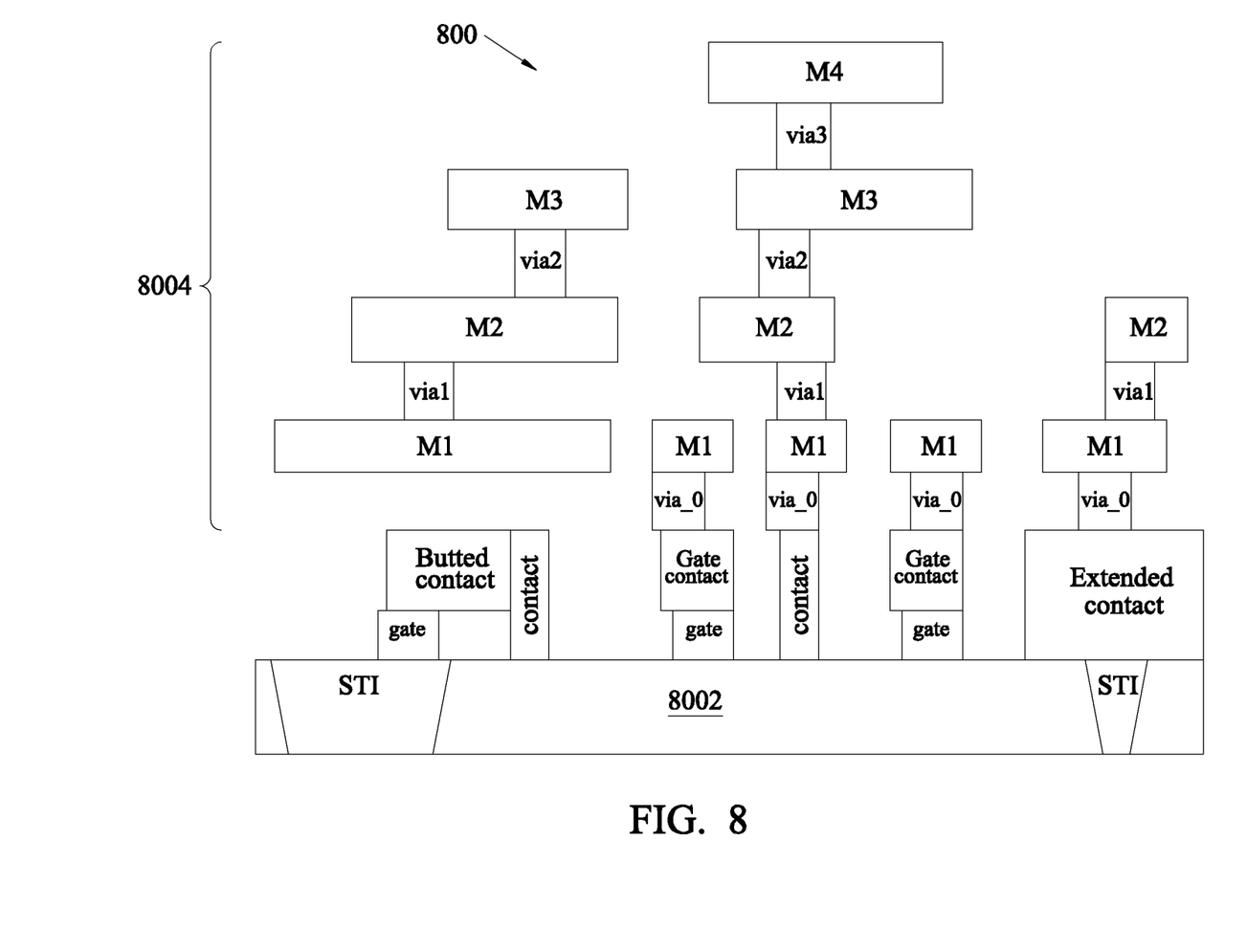
FIG. 8 illustrates an exemplary cross-sectional view of an embodiment of a semiconductor device construed according to one or more aspects of the present disclosure.

While certain embodiments are provided herein that describe providing an interconnect architecture using a given metal layer (e.g., Metal-1 (M1), Metal-2 (M2), Metal-3 (M3)) of a multi-layer interconnect (MLI), one of ordinary skill in the art would appreciate that other metal layers may be used to implement the interconnect architecture of the present disclosure. For example, the embodiments discussed herein may be implemented using a multi-layer interconnect (MLI) such as illustrated in FIG. 8 including, for example, via 0, Metal-1 (M1), via 1, Metal-2 (M2), via 2, Metal-3 (M3), via 3, and Metal-4 (M4). The MLI includes densely layered structure of conductive lines (e.g., extending a length in a direction parallel a top surface of the substrate), interconnecting vertically extending conductive vias, and interposing insulating films that provide electrical interconnection (and associated insulating) to and among various devices on a substrate. While in some embodiments two, three or four metal layers are shown, any number of metal layers may be provided and used to implement the present disclosure. A MLI structure may also be referred to as back-end metallization having numerous stacked metal layers, extending in a horizontal direction, and vertically extending vias or contacts, that provide connection between and to the stacked metal layers. The MLI may be disposed over the substrate and above the contact level (e.g., above the gate contact, source/drain contact, etc) see FIG. 8. The MLI may be formed over the contact layer or front-end-of-the-line (FEOL) contact layer as discussed below.

Generally, relative terms such as "first metal layer" and "second metal layer" are used for ease of identification and may not necessitate that the feature be formed on any specific metal layer, e.g., M1 and M2, respectively unless specifically noted. The present disclosure describes a metal layer as the next adjacent metal layer for two metal layers in a stack that are interposed by dielectric and/or a via, but without another metal layer providing a routing in a substantially horizontal direction—for example, M2 is the next adjacent metal layer to M1, each of M5 and M3 are the next adjacent metal layer to M4, and so forth.

Referring to FIG. 1, illustrated is a layout of a memory cell 100. The cell 100 shown is an embodiment of an SRAM memory cell. The cell comprises a circuit that has 2 cross-latch CMOS FET inverters forming a flip-flop and two pass gate transistors (also known as pass transistors, access transistors, active transistors). See FIGS. 6-7. Specially, the cell 100 includes pull-up transistors (PU-1 and PU-2) and pull-down transistors (PD-1 and PD-2), as well as pass gate transistors PG-1 and PG2, each annotated on their respective gate structure. Pull-up transistors as defined in this disclosure can be transistors that pull either towards Vcc or Vss. A plurality of the memory cells 100 may be arranged in one or more arrays to couple to peripheral control circuitry and form a memory device (e.g., SRAM device).

Figure 1A:
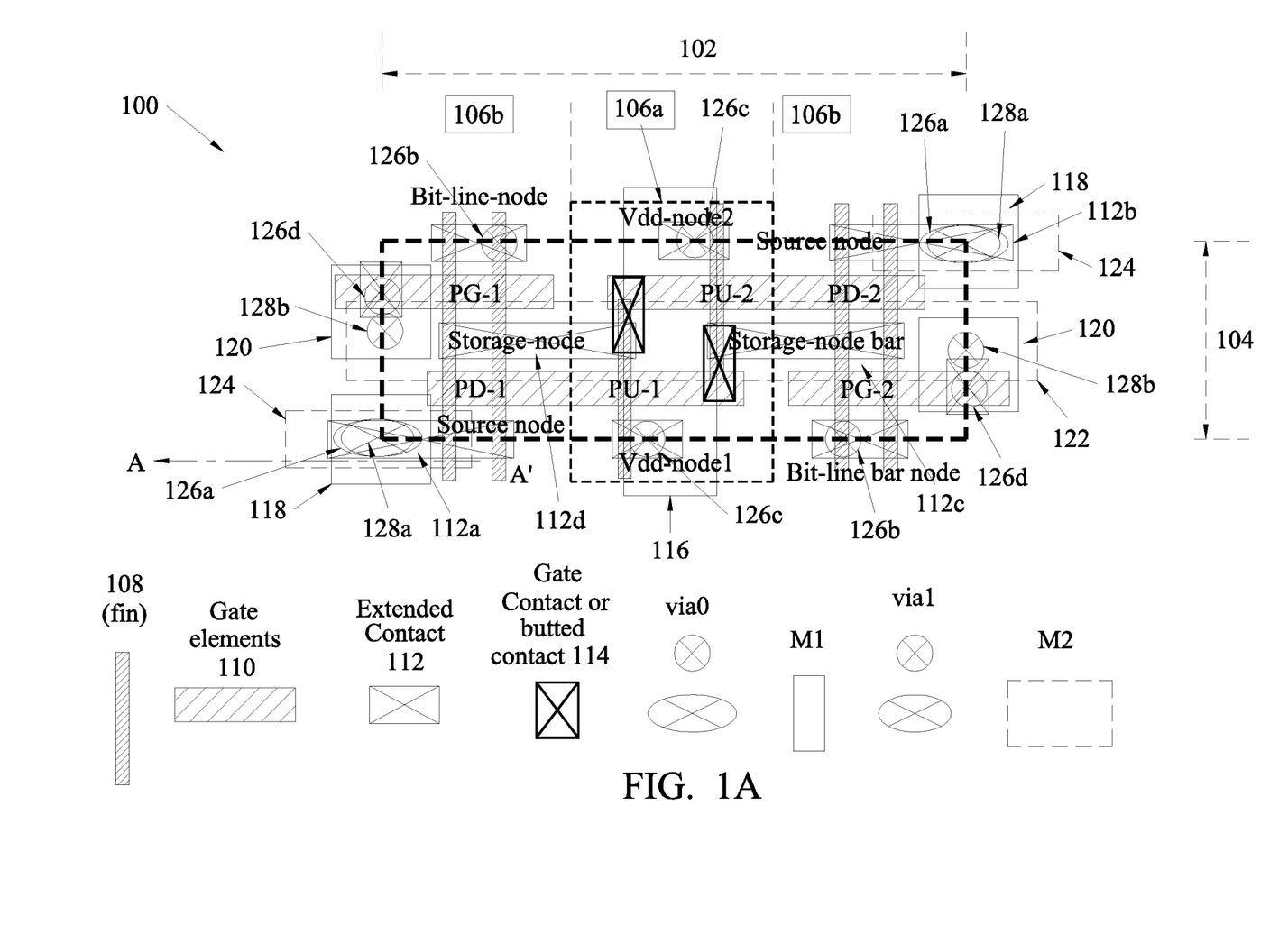
FIG. 1A illustrates a top view of a layout of a memory cell according an embodiment of the present disclosure.

The memory cell 100 includes a rectangular shape with a length 102 and a width 104. A region of a first dopant type (e.g., N-well) 106a interposes regions 106b of a second dopant type (e.g., P_well) that are parallel to a width 104 of the cell 100. FIG. 1A illustrates up to the second metal layer (M2). In other words, FIG. 1A illustrates the gate-level, the contact-level (extended contact 112 and gate/butted contact 114), via 0, first metal layer (M1), via 1, and the second metal layer (M2). See FIG. 8. Although not shown in FIG. 1A, other metal and via layers may also include features of the memory cell 100.

A plurality of active fin elements 108 are illustrated for the memory cell 100. In other embodiments, one or more of the transistors of the memory cell 100 may be planar transistors. The fin elements 108 may include a suitable semiconductor material extending from a surface of a semiconductor substrate, where isolation structures (e.g., shallow trench isolation features) may interpose the fin elements. Gate elements 110 are formed interfacing one or more surfaces of the fin elements 108.

Figure 6:
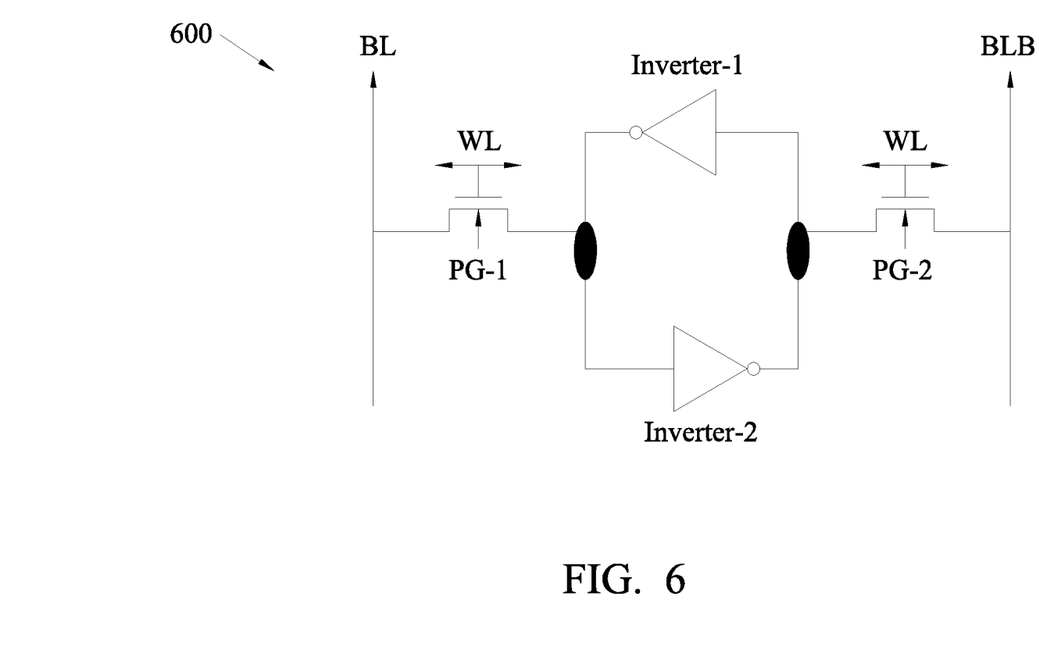
FIG. 6 illustrates exemplary schematic view of a memory cell that may be constructed according to various aspects of the present disclosure.

Gate elements 110 provide gates for various transistors making up the memory cell 100 including pass-gate transistors, pull-up transistors, pull-down transistors. One example schematic implemented by the memory cell 100 is illustrated in FIGS. 6 and/or 7. The memory cell 100 includes pass-gate transistor (PG-1), pass-gate transistor (PG-2) each described in further detail below with reference to FIG. 7. The memory cell 100 also includes cross-coupled inverters provided by pull-up transistor (PU-1), pull-up transistor (PU-2), pull-down transistor (PD-1), pull-down transistor (PD-2), which also may be interconnected substantially similar to as discussed in FIG. 7.

The gate elements 110 may include suitable gate electrode and gate dielectric layers. For example, the gate dielectric may include a high-k dielectric material layer. The gate electrode may include polysilicon or an appropriate work function metal.

The next layer above the substrate illustrated by the memory cell 100 of FIG. 1A is the contact layer. The contact layer is also referred to as the front-end-of-the-line (FEOL) contact layer. (Note FIG. 8 illustrates a cross-sectional view of ease of understanding.) The contact layer interfaces the gate elements 110 and/or regions of the underlying substrate including, but not limited to source and drain elements associated with the transistors discussed above. The contact layer also interfaces the "via 0" layer. In some embodiments, the contact layer includes longer or extended contacts 112 and gate contacts and/or butted contacts 114. Extended contacts 112 may provide for an interconnection with source/drain nodes (e.g., on fins 108) of relevant transistors. The contact layer may also include gate contacts and/or butted contacts 114. In some embodiments, the extended contacts 112 have a length to width ratio of larger than 3:1.

Extended contact 112a provides a contact between the source of the PD-1 transistor and Vss. Extended contact 112b provides a contact between the source of the PD-2 transistor and Vss. Extended contact 112c provides a coupling between the drains of the PD-2 transistor and the drain of the PU-2 transistor as well as extending to the gate contact 114 to provide coupling via the gates 110 of the PU-1 and PD-1 transistors. Similarly, extended contact 112d provides a coupling between the drains of the PD-1 transistor and the drain of the PU-1 transistor as well as extending to the gate contact 114 to provide coupling via the gates 110 of the PU-2 and PD-2 transistors. Extended contacts include those with a rectangular shape; extended contacts can extend over a portion of a substrate that provides an isolation structure. Again, the extended contacts have a length to width ratio of greater than 3:1.

The next layer above the substrate illustrated by memory cell 100 of FIG. 1A is the via0 layer. The via0 layer interfaces the contact layer, described above, and interfaces a first metal layer (M1), described below. Via0 layer of the memory cell 100 includes first via(s) 126a that provides interconnection to a Vss island 118 on M1. Specifically, vias 126a of the Via0 provide an interconnection between Vss and the respective drain(s) of the pull-down transistors (through the extended contact 112a). The vias 126a are rectangular in shape, as discussed in further detail below with reference to FIG. 1B. Via0 layer of the memory cell 100 also includes second via(s) 126b that provide interconnections between the respective drain(s) of the pass-gate transistors (PG-1, PG-2) and the respective bit line (BL) or complementary bit line (or bit line bar or BLB) (not shown, but which may traverse on M1 or in other embodiments, a higher metal layer). The second vias 126b may be circular or substantially square in shape, as discussed in further detail below with reference to FIG. 1B. The Via0 layer of the memory cells also includes third via(s) 126c that provide interconnections between respective sources of the pull-up transistors (PU-1, PU-2) and Vdd line 116. The third vias 126c may be circular or substantially square in shape, as discussed in further detail below with reference to FIG. 1B. The Via0 layer of the memory cells also includes fourth via(s) 126d that provide interconnections between respective gates 110 of the pass-gate transistors (PG-1, PG-2) and the word line 122 (through interconnection with the word line landing pads 120 and via elements of 128b of Via1). The fourth vias 126d may be circular or substantially square in shape, as discussed in further detail below with reference to FIG. 1B. In an embodiment, vias 126b, 126c, and 126d have substantially similar geometry. In a further embodiment, vias 126a have a different geometry, specifically, a rectangular shape. Each of vias 126a, 126b, 126c, and 126d are coplanar and disposed on Via0.

The next layer above the substrate illustrated by memory cell 100 of FIG. 1A is a first metal layer referred to a M1. M1 provides Vdd/CVdd line conductors 116, Vss island(s) 118, word line WL landing pads 120. In an embodiment, the bit line (BL) and complementary bit line (BLB) (not shown) are provided on M1 and traverse parallel the width of the memory cell 100 between the landing pad 120/island 118 and the CVdd line 116. In some embodiments, the BL and BLB may traverse parallel the width of the memory cell 100 on a higher metal layer.

The next layer above the substrate illustrated by memory cell 100 of FIG. 1A is a Via1 layer. Via1 provides an interface between M1 and M2 layers of the MLI. Via1 layer of the memory cell 100 includes first via(s) 128a that provides interconnection in the Vss node, namely from the Vss island 118 on M1 to Vss island 124 of M2. Specifically, vias 128a of the Via1 provide an interconnection between Vss and the respective drain(s) of the pull-down transistors (through the extended contact 112a, via 126a of Via0, and various landing pads). The vias 128a are rectangular in shape, as discussed in further detail below with reference to FIG. 1C. In an embodiment, the via 128a is vertically aligned (within fabrication tolerances) with the via 126a of Via0. Thus, the vias 128a and the vias 126a may be termed stacked vias.

Via1 layer of the memory cell 100 also includes second via(s) 128b that provide interconnections between respective gates 110 of the pass-gate transistors (PG-1, PG-2) and the word line 122 of M2 (through other components including the word line landing pads 120, via elements of 126d of Via0, and contact elements 114). Thus, in an embodiment vias 128a and 128b have a different geometry (e.g., rectangular and circular/square), while being coplanar and disposed on Via1 layer. In other embodiments, the via(s) 128b providing a connection path between WL landing pad (M1) and a WL conductor (M2) are rectangular in shape including dimensions of X1/Y1, discussed below.

The next layer above the substrate illustrated by memory cell 100 of FIG. 1A is the second metal layer, or M2. M2 as illustrated provides word lines 122 and Vss islands/landing pads 124. It is noted that routing of other elements may additionally and/or alternatively be provided in M2, including but not limited to bit lines, complementary bit lines, and/or other suitable memory cell components.

Thus, the memory cell 100 includes a Vss node having components including a Vss island on a first metal layer (e.g., M1) and a second metal layer (e.g., M2) as illustrated by elements 118 and 124. (It is noted that on at least one metal layer of the device there is a conductive Vss line, not shown in FIG. 1A). In some embodiments, the configuration of Vss node components (Vss islands) can serve to provide bit line and word line capacitance (RC) reduction. In some embodiments, the Vss node components, Vss islands (e.g., 118 and 124), are disposed on a boundary of the memory cell 100 (see dashed line). The Vss node components providing interconnections, including vias 126a and 128a, may extend between the Vss islands on adjacent metal lines and may also provide benefits of an improved Vss node connection in some embodiments. In some embodiments improvements may be provided by the Vss node connection due to the lessening of the IR drop (e.g., during read cycle) thus improving read speed and/or cell stability (Vcc min).

Certain embodiments provide for lower BL capacitance by BL RC delay reduction including, for example, by implementing some embodiments of square/circular vias to provide connection to the BL. Such configurations can also, in some embodiments, provide for a wider BL width and space (to Vdd/CVdd), which may provide BL RC delay reduction. Some embodiments of such configurations also allow for wider WL width, which can result in WL resistance reduction.

It is note that while not shown in FIG. 1A, bit line and complementary bit lines also run parallel the width of the cell (while the word lines 122 run parallel the length of the cell). In some embodiments, the BL and BLB run on M1 as discussed above. It is understood, however, that various other layouts would be evident to one skilled in the art. In some embodiments of the memory cell 100, the Vss conductor line is located on a third metallization layer (e.g., M3), which may be disposed above M2. In some embodiments of the memory cell 100, one Vss conductor line is located on a $4^{th}$ metal layer (e.g., M4). In a further embodiment, a Vss conductor line is located on each of a third and fourth metal layer. In some embodiments, the WL conductor line (e.g., 122) is thicker (e.g., thicker metallization) than a respective BL (e.g., on M1).

Conductive materials form the metal layers of the MLI (including M1 and M2) and include, for example, aluminum, aluminum alloy (e.g., aluminum/silicon/copper), copper, copper alloy, titanium, titanium nitride, tantalum, tantalum nitride, tungsten, silicide, polysilicon, and/or other suitable conductive materials. In an example, a damascene and/or dual damascene process is used to form the metal layers. Contact level components, Via0 components, Via1 components may include copper, tungsten, and/or other suitable conductive materials. Any one of the contacts, vias, metal lines, and the like may be insulated from one another by suitable dielectric material such as, for example, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials.

The device of memory cell 100 may be disposed on a semiconductor substrate. In an embodiment, the semiconductor substrate includes silicon. Other example compositions include, but are not limited to, silicon germanium, silicon carbide, gallium arsenide, indium arsenide, indium phosphide, silicon germanium carbide, gallium arsenic phosphide, gallium indium phosphide, germanium, and/or other suitable materials.

Figure 1B:
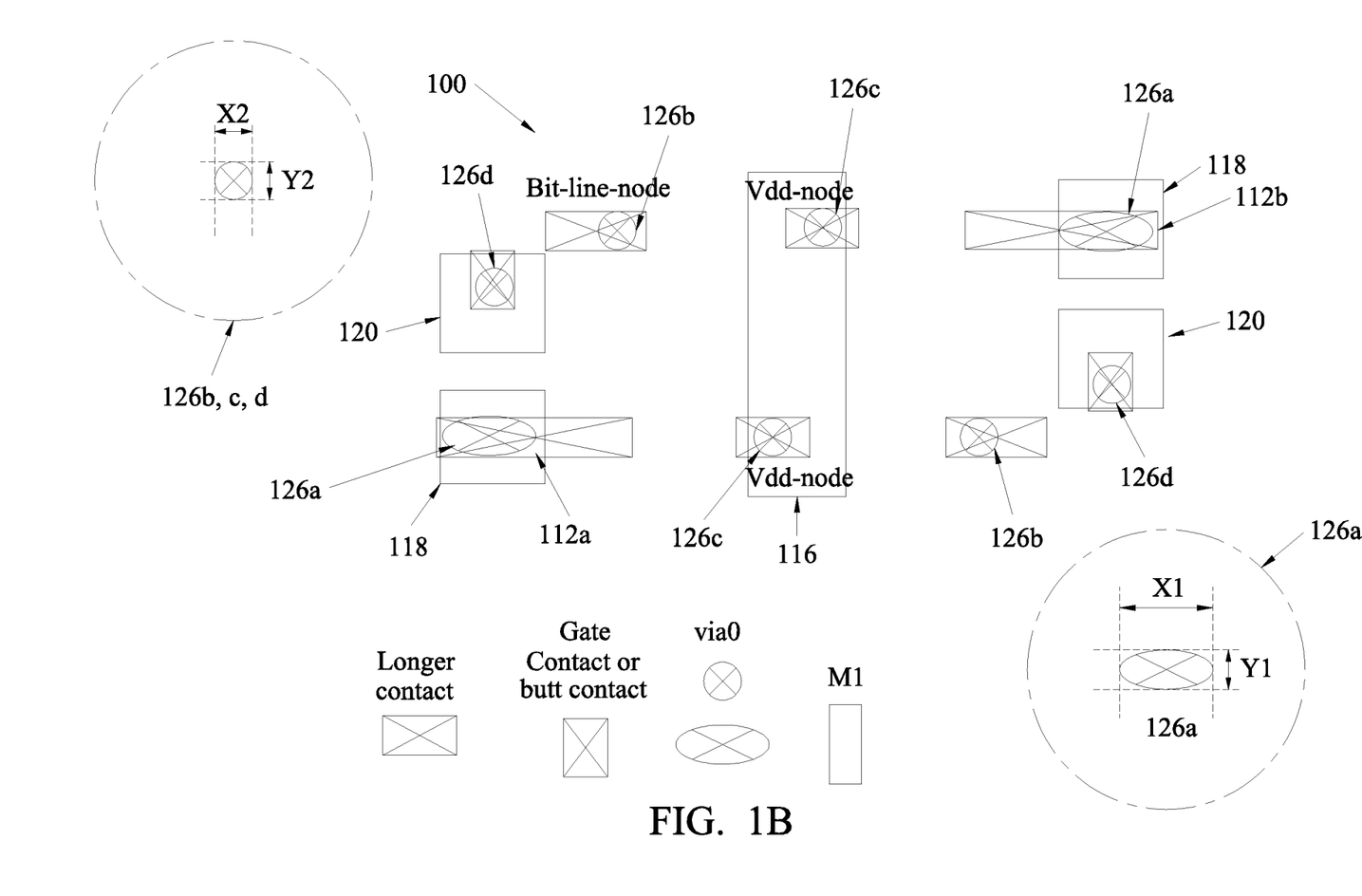
FIG. 1B illustrates a top view of a selected layers of the layout of a memory cell of FIG. 1A, according an embodiment of the present disclosure.

Referring to FIG. 1B, illustrated is a portion of the memory cell 100 of FIG. 1A. For ease of reference, the memory cell 100 of FIG. 1B has illustrated only the contact layer, Via0 and M1 layer illustrated. FIG. 1B illustrates that the vias 126a, which provides connection to Vss nodes, are rectangular in shape having a length X1 that is greater than its width Y1 by at least approximately 50%. In some embodiments, X1/Y1 is approximately 1.5 or greater, where X1 is greater than Y1. In an embodiment, X1/Y1 is approximately 2.0. In some embodiments, X1/Y1 is greater than approximately 1.5 and less than approximately 3. FIG. 1B also illustrates that the vias 126b, 126c, and/or 126d are substantially square or circular in shape having a length X2 that is within approximately 20% of the width Y2. In some embodiment, X2/Y2 is approximately 1.2 or less. In some embodiments, X2/Y2 is between approximately 0.8 and 1.2. In some embodiments, X2/Y2 is between approximately 1.5 to 0.5.

Figure 1C:
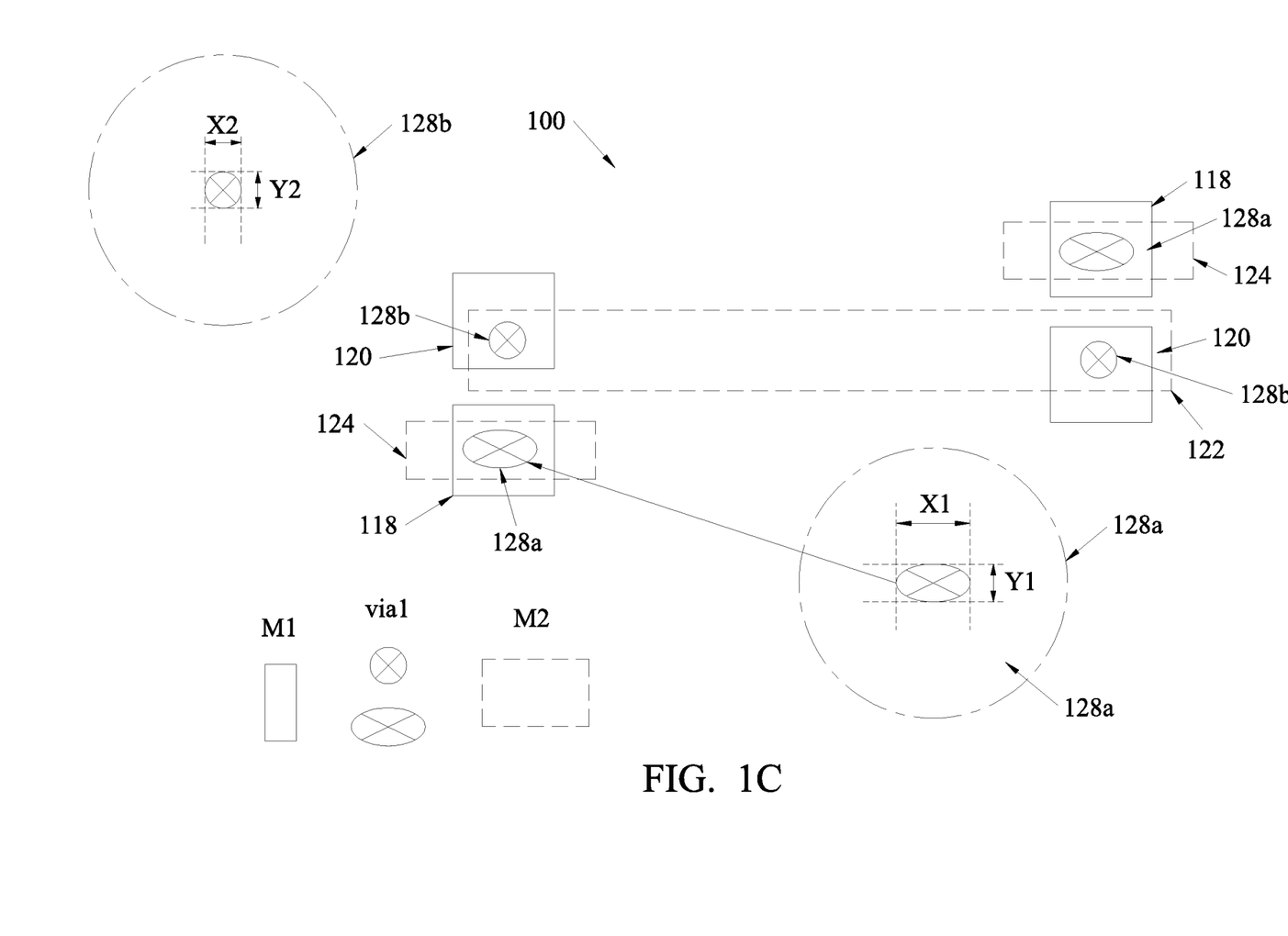
FIG. 1C illustrates a top view of other selected layers of the layout of a memory cell of FIG. 1A, according an embodiment of the present disclosure.

Referring to FIG. 1C, illustrated is a portion of the memory cell 100 of FIG. 1A. For ease of reference, the memory cell 100 of FIG. 1C has illustrated only M1, Via1 and M2 layers. FIG. 1C illustrates that the vias 128a, which provide connection to Vss nodes, are rectangular in shape having a length X1 that is greater than its width Y1 by at least approximately 50%. In some embodiments, X1/Y1 is approximately 1.5 or greater, where X1 is greater than Y1. In an embodiment, X1/Y1 is approximately 2.0. In some embodiments, X1/Y1 is greater than approximately 1.5 and less than approximately 3. FIG. 1C also illustrates that the vias 128b are substantially square or circular in shape having a length X2 that is within approximately 20% of the width Y2. In some embodiment, X2/Y2 is approximately 1.2 or less. In some embodiments, X2/Y2 is between approximately 0.8 and 1.2. In some embodiments, X2/Y2 is between approximately 1.5 to 0.5. While FIGS. 1B and 1C illustrate that Via0 and Via1 have the same dimensions, this is not required.

Figure 1D:
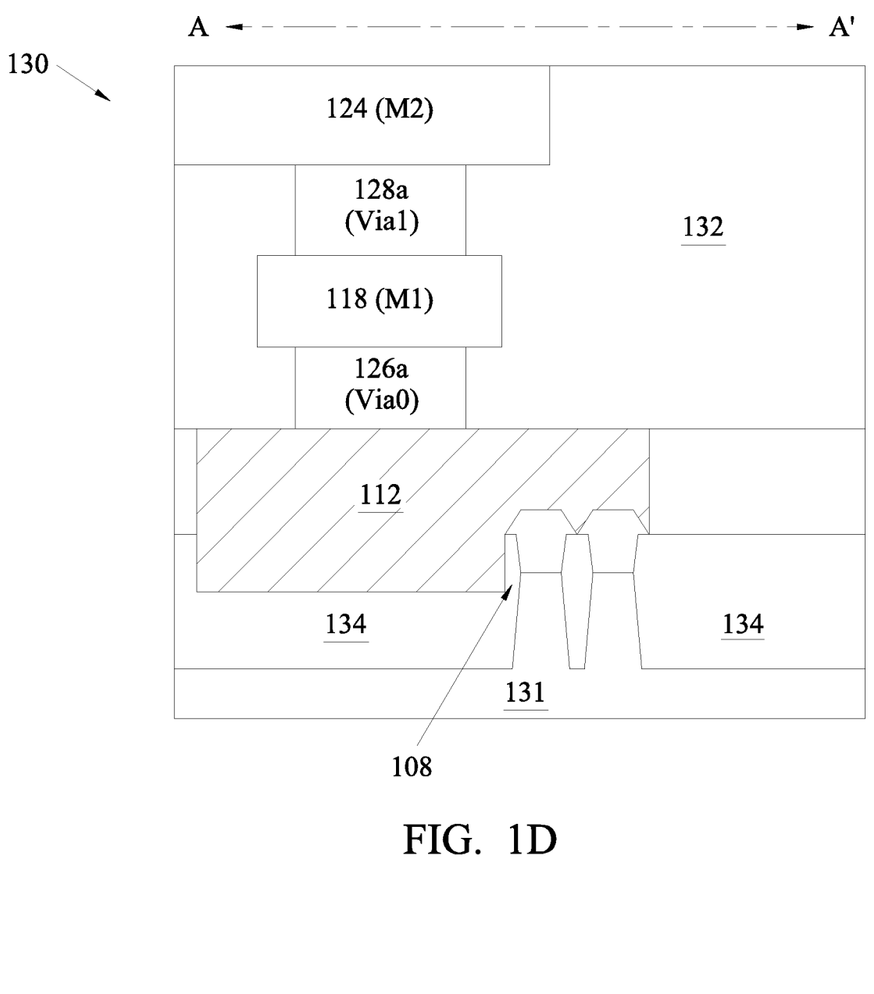
FIG. 1D illustrates an exemplary cross-sectional view of a portion of a device corresponding to the memory cell of FIG. 1A.

FIG. 1D illustrates a cross-sectional view of a portion 130 of a device, which is fabricated according to the memory cell 100. The device portion 130 is illustrated through the cross-sectional cut A-A' of FIG. 1. The device portion 130 in particular illustrates the Vss node connection structure. The device portion 130 includes a substrate 131 having fin elements 108 extending therefrom. An extended contact 112 disposed on a source region of the fin 108. The first via 126a is disposed on Via0 layer and interfaces the contact 112a. The Vss island 118 is disposed on M1. The via 128a is disposed on the Vss island 118. The Vss island 124 (M2) is disposed on the via 128a. Dielectric material 132 surrounds the MLI including Via0, M1, Via1, M2. A shallow trench isolation (STI) feature 134 is disposed on the substrate 131.

Elements 118 and/or 124 include, for example, aluminum, aluminum alloy (e.g., aluminum/silicon/copper), copper, copper alloy, titanium, titanium nitride, tantalum, tantalum nitride, tungsten, silicide, polysilicon, and/or other suitable conductive materials. In an example, a damascene and/or dual damascene process is used to form the metal layers. Contact 112, via 126a, and/or via 128a may include copper, tungsten, and/or other suitable conductive materials. The dielectric material 132 may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials.

In an embodiment, the semiconductor substrate 131 includes silicon. Other example compositions include, but are not limited to, silicon germanium, silicon carbide, gallium arsenide, indium arsenide, indium phosphide, silicon germanium carbide, gallium arsenic phosphide, gallium indium phosphide, germanium, and/or other suitable materials. The STI feature 134 includes a suitable dielectric composition such as, silicon oxide, silicon nitride, silicon oxynitrides, and/or other suitable materials. The STI feature 134 may be a multi-layer structure.

Figure 2:
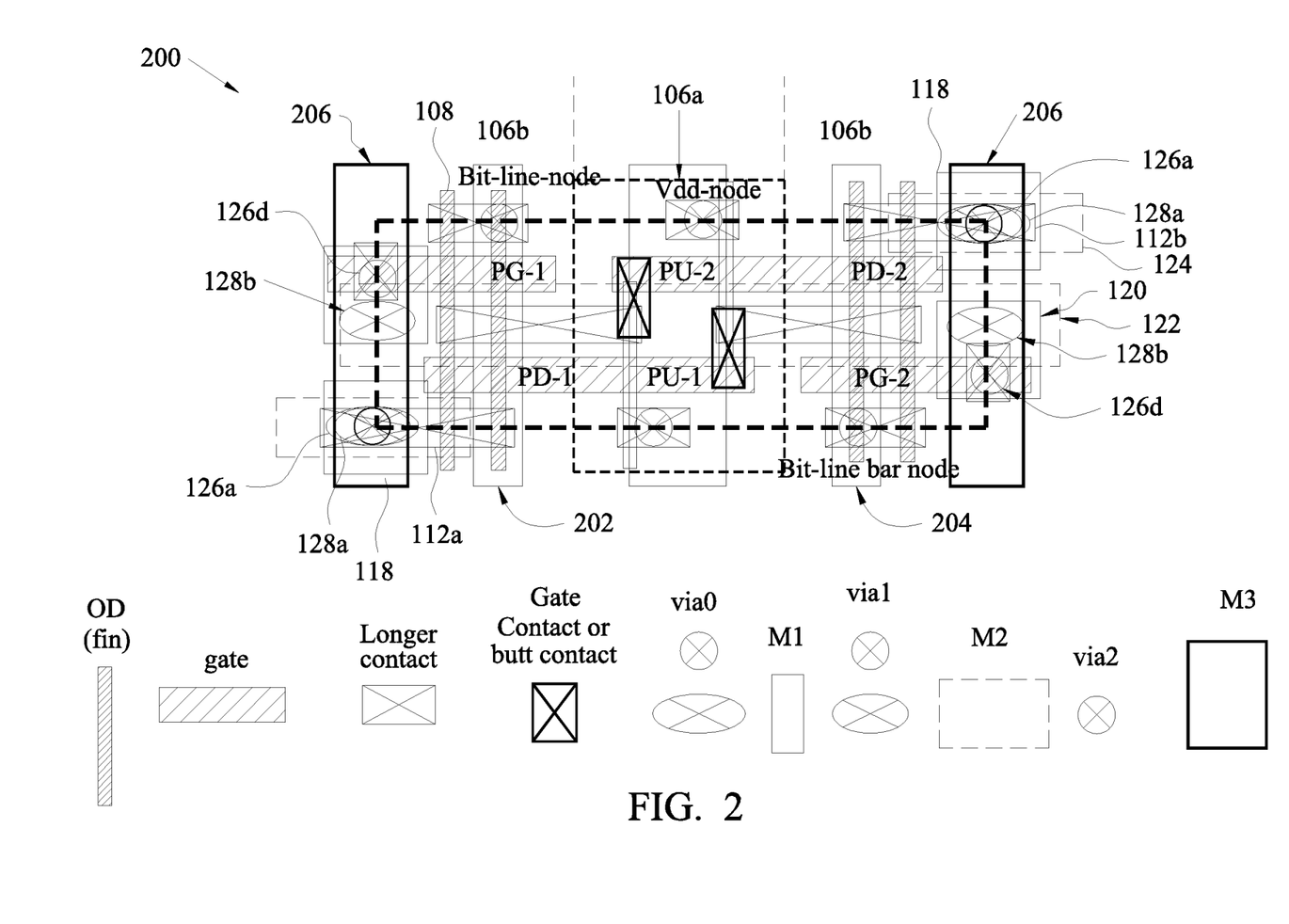
FIG. 2 illustrates a top view of a layout of a memory cell according another embodiment of the present disclosure.

Referring now to FIG. 2, illustrated is the memory cell 200, which may be substantially similar to the memory cell 100 of FIGS. 1A, 1B, 1C, and 1D except as noted herein. The fin 108, gate elements 110, contact level including elements 112 and 114, and Via0 level including vias 126a, 126b, 126c, and 126d, may be substantially similar to as discussed above with reference to the memory cell 100. Like the memory cell 100 discussed above, M1 also includes Vss island 118, landing pad 120, and Vdd line 116. M1 of FIG. 2 and the memory device 200 also includes BL 202 and BLB 204. BL 202 and BLB 204 are disposed on M1. As illustrated with respect to memory cell 100, memory cell 200 includes a word line (WL) 122 on M2, however, other configurations are possible. Vss components including Vss islands/landing pads 124 are disposed on M2, also as discussed above. The memory cell 200 also illustrates a third metal layer (e.g., M3 above M2), and a Via2 layer which interconnect second and third metal layers (e.g., M2 and M3). As illustrated in the memory cell 200, Vss conductor lines 206 are disposed on M3 and connected by Via2 component to the underlying Vss islands 124 on M2. In some embodiments, an additional Vss conductor line is also disposed on the fourth metal layer (e.g., M4).

It is noted with reference to the memory cell 200 that the vias 128b are rectangular in shape. In an embodiment, the via 128b include substantially similar dimensions as via 128a (discussed above). In an embodiment, the via 128b has a dimension of X1/Y1 which is greater than approximately 1.5. In an embodiment, X1/Y1 is approximately 2.0. In some embodiments, X1/Y1 is greater than approximately 1.5 and less than approximately 3. The via 128b may provide interconnections WL landing pads 120 on M1 and WL conductor 122 on M2.

Figure 3:
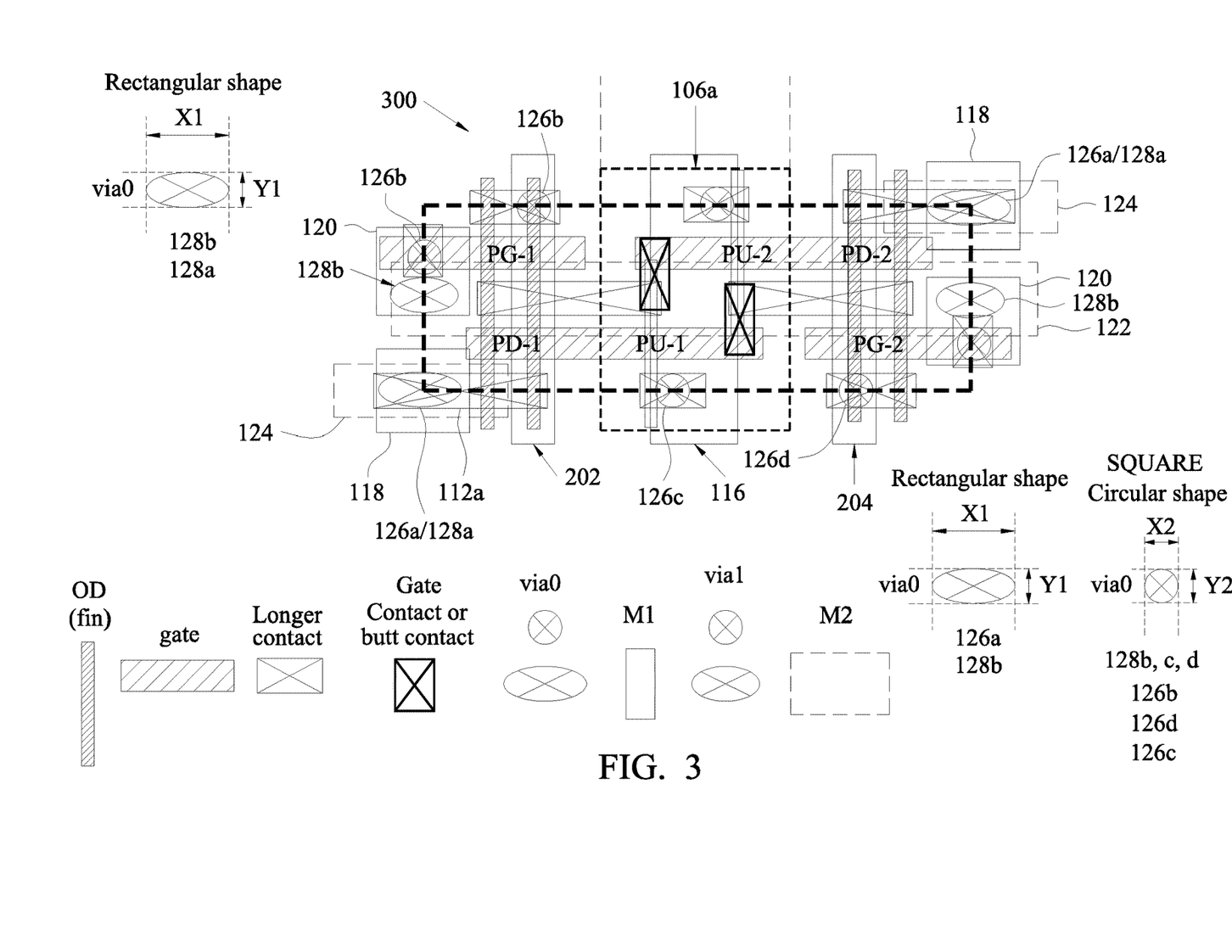
FIG. 3 illustrates a top view of a layout of another memory cell, according an embodiment of the present disclosure.

Referring now to FIG. 3, illustrated is an embodiment of a memory cell 300, which may be substantially similar to the memory cells 100 and/or 200, discussed above with reference to FIGS. 1A, 1B, 1C, 1D, and 2. The memory cell 300 illustrates the via 128b is rectangular in shape as discussed above with reference to FIG. 2. It is further noted that, as discussed above, the vias 126b provide connection to a bit line 202 and bit line bar 204 respectively. The vias 126b may be substantially circular/square in shape. In other words, the vias 126b may have a dimension X2 (e.g., length)/Y2 (e.g., width) that is between approximately 0.8 and 1.2. In an embodiment, the vias 126a and/or 128b may be of rectangular shape. In a further embodiment, the vias 126a and/or 128b may have a dimension of X1 (e.g., length)/Y1 of greater than approximately 1.5. In an embodiment, X1/Y1 is approximately 2.0. In some embodiments, X1/Y1 is greater than approximately 1.5 and less than approximately 3. It is noted that the vias 126a and/or 128b may not need to have the same absolute dimensions. The Vss conductor line may be on M3 or any other layer of the cell 300.

Figure 4:
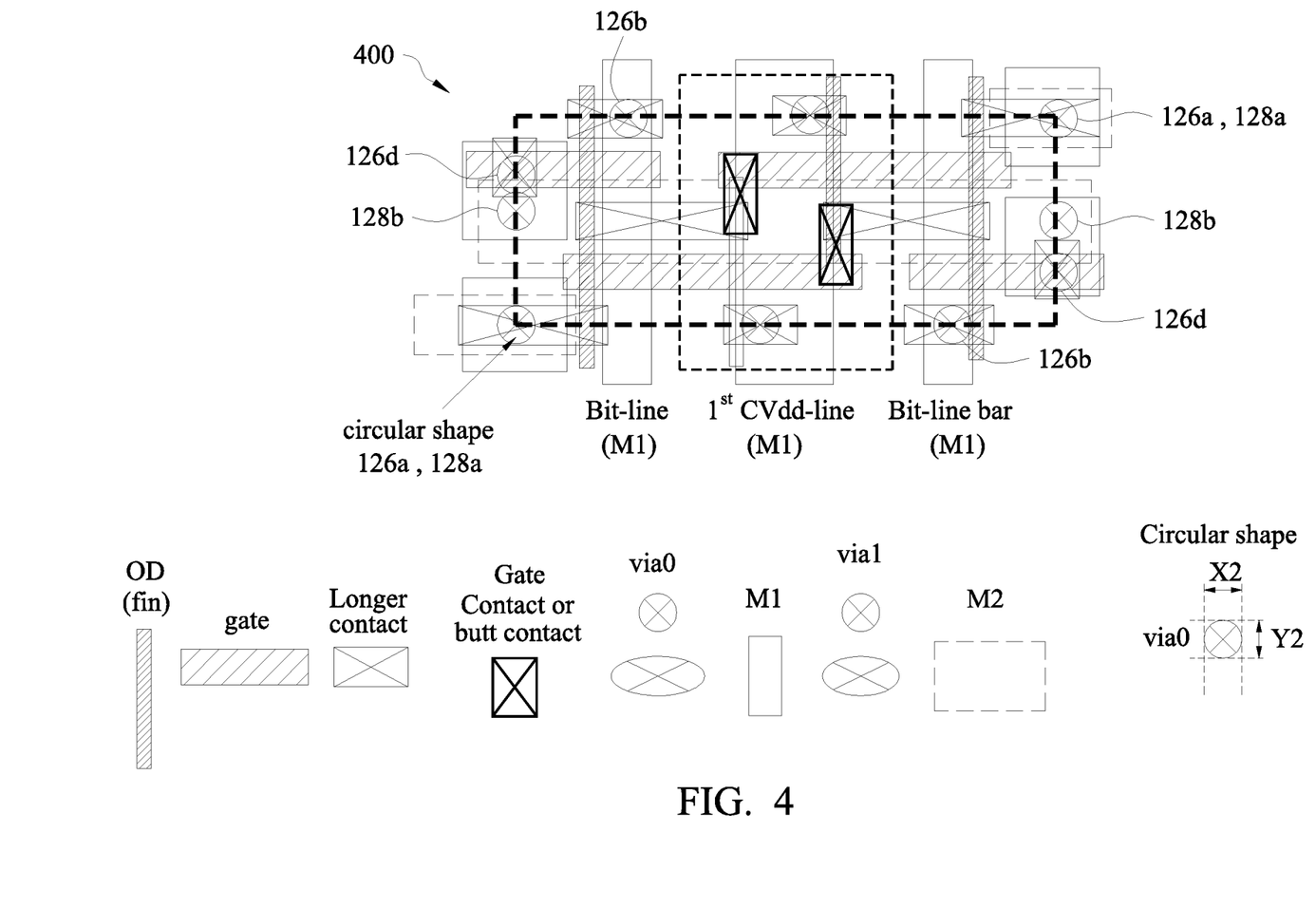
FIG. 4 illustrates a top view of another layout of a memory cell that may be used in a memory device in combination with the memory cells of FIGS. 1A, 2, and/or 3.

FIG. 4 illustrates a memory cell 400 that may be substantially similar to as discussed above with reference to the memory cell 100, 200 and/or 300. However, the memory cell 400 does not include, as illustrated, any rectangular shaped vias (e.g., Via0 or Via1) in contrast to above. Rather, the vias each have a circular/square shape in which the length/width is between approximately 0.8 and 1.2. In an embodiment, a memory device includes multiple arrays of memory cells. In an embodiment, the memory device (e.g., on a single semiconductor substrate) includes a first array of one of the memory cell 100, 200 and/or 300 and a second array of the memory cells 400.

Figure 5:
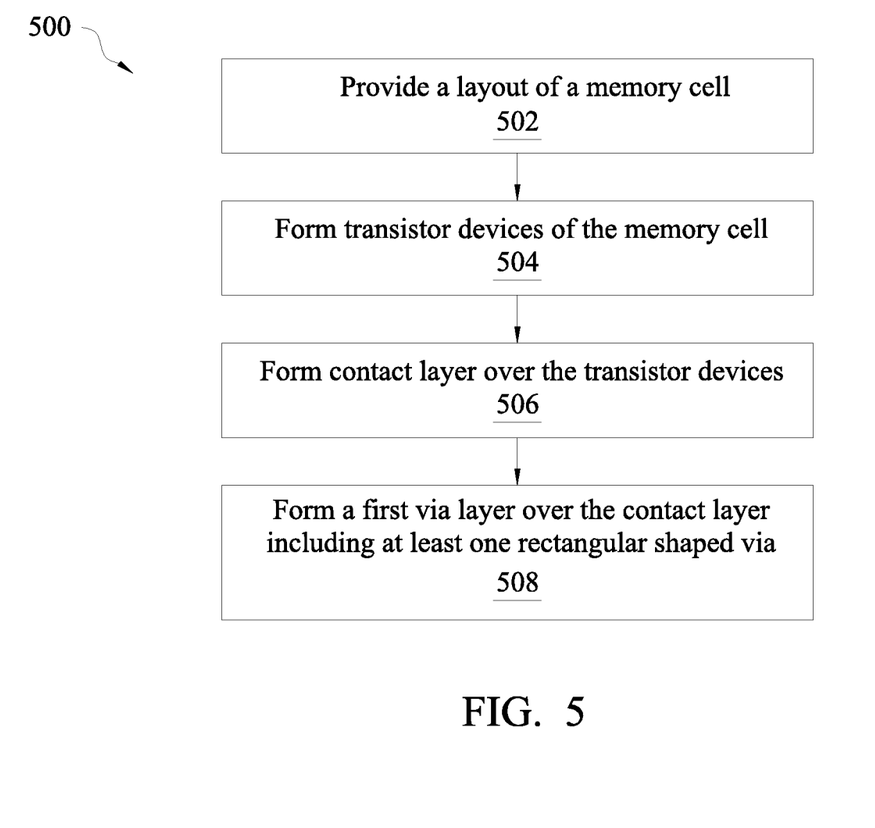
FIG. 5 illustrates a flow chart of an embodiment of a method of fabricating a memory cell according to aspects of the present disclosure.

FIG. 5 illustrates a method 500 of forming a memory device. In an embodiment, the method 500 is used to form a memory device such as an SRAM. The method 500 may be used to fabricate a device including any one of the memory cell layouts discussed above.

The method 500 begins at block 502 where a layout is provided. The layout may include an array of memory cells. The memory cells may be substantially similar to the memory cell 100 of FIGS. 1A, 1B, and/or 1C, the memory cell 200 of FIG. 2, the memory cell 300 of FIG. 3, and/or the memory cell 400 of FIG. 4. In an embodiment, the layout is provided in a suitable computer readable medium format such as, for example, GDSII, OASIS, and/or other suitable layout formats.

Figure 7:
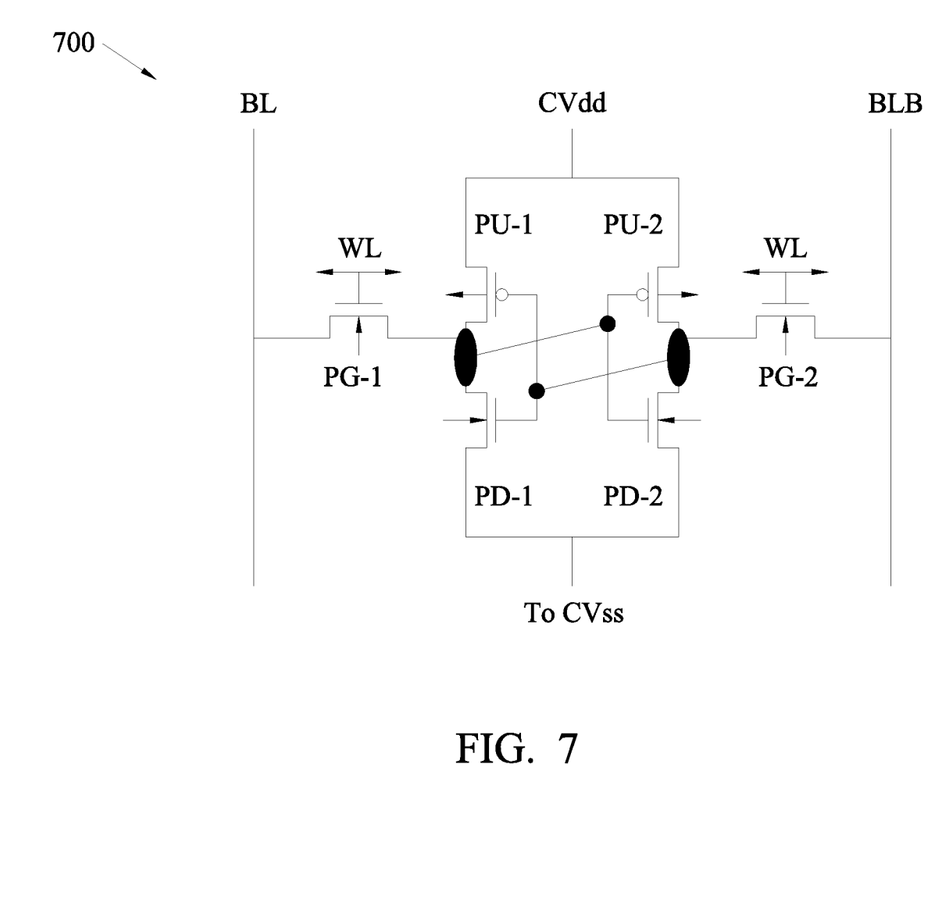
FIG. 7 illustrates exemplary schematic view at a transistor level of a memory cell that may be constructed according to various aspects of the present disclosure and corresponding to FIG. 6.

The method 500 then proceeds to block 504 where a plurality of transistor devices is formed on a semiconductor substrate. The transistor devices may include gate structures and respective source/drain features as illustrated in the schematic of FIG. 7 below. The transistors may be pull-up transistor, pull-down transistors, pass-gate transistors, and/or other transistor types suitable to form a memory cell.

The method 500 then proceeds to block 506 where a contact layer (or FEOL contact) is formed on the substrate. The contact layer provides an interconnection to suitable features of the transistors (e.g., gate, source, or drain).

The method 500 then proceeds to block 508 where a first via layer is formed over the contact layer. In an embodiment, the first via layer is Via0. In an embodiment, the first via layer is Via0 or higher via layer (and other via and/or metal layers interpose the contact layer and the first via layer). In some embodiments, forming the first via layer includes depositing a layer of dielectric on the substrate. A via pattern is then formed over the dielectric. The via pattern may include photoresist, hard mask, or other materials suitable to form a masking element. The via pattern may include vias of more than one dimension. In an embodiment, the via pattern includes circular/square vias and rectangular vias. In an embodiments, holes of a first dimension (e.g., circular/square) may be etched simultaneously with holes of a second dimension (e.g., rectangular). The holes may then filled with conductive material using suitable deposition processes.

The method 500 then proceeds to form other layers of the memory device including conductive lines and additional via components, including as discussed above.

Referring now to FIG. 6, illustrated is a schematic view of an SRAM cell 600 that may be constructed to various aspects of the present disclosure in one embodiment. The SRAM cell 600 is a single port SRAM cell including a pair of inverters and pass-gate transistors for accessing the cell. An embodiment of the SRAM cell 600 is discussed in further detail below with reference to the SRAM cell 700 of FIG. 7.

FIG. 7 is a schematic view of a SRAM cell 700 that may be constructed according to various aspects of the present disclosure in one embodiment. In some embodiments, the SRAM cell 700 includes fin field-effect transistors (FinFETs). In some embodiments, the SRAM cell 700 includes planar transistors.

The SRAM cell 700 includes a first and second inverters that are cross-coupled as a data storage. The first inverter includes a first pull-up device formed with a p-type field-effect transistor (pFET), referred to as PU-1. The first inverter includes a first pull-down device formed with an n-type field-effect transistor (nFET), referred to as PD-1. The drains of the PU-1 and PD-1 are electrically connected together, forming a first data node. The gates of PU-1 and PD-1 are electrically connected together. The source of PU-1 is electrically connected to a power line Vcc. The source of PD-1 is electrically connected to a complimentary power line Vss. The second inverter includes a second pull-up device formed with a pFET, referred to as PU-2. The second inverter also includes a second pull-down device formed with an nFET, referred to as PD-2. The drains of the PU-2 and PD-2 are electrically connected together, forming a second data node. The gates of PU-2 and PD-2 are electrically connected together. The source of PU-2 is electrically connected to the power line Vcc. The source of PD-2 is electrically connected to the complimentary power line Vss. Furthermore, the first data node is electrically connected to the gates of PU-2 and PD-2, and the second data node is electrically connected to the gates of PU-1 and PD-1.

The SRAM cell 700 further includes a first pass-gate device formed with an n-type field-effect transistor (nFET), referred to as PG-1, and a second pass-gate device formed with an n-type field-effect transistor (nFET), referred to as PG-2. The source of the first pass-gate PG-1 is electrically connected to the first data node and the source of the first pass-gate PG-2 is electrically connected to the second data node, forming a port for data access. Furthermore, the drain of PG-1 is electrically connected to a bit line ("BL"), and the gate of PG-1 is electrically connected to a word line ("WL"). Similarly, the drain of PG-2 is electrically connected to a bit line bar or the bit line BL, and the gate of PG-2 is electrically connected to the word line WL.

As mentioned above, any of the nFETs and/or pFETs described above may be nFinFET or pFinFETs respectively. In one embodiment, the various nFETs and pFinFETs are formed using high-k metal gate technology so the gate stacks includes a high-k dielectric material layer for gate dielectric and one or more metals for gate electrode. The cell 700 may include additional devices such as additional pull-down devices and pass-gate devices. In one example, each of the first and second inverters includes one or more pull-down devices configured in parallel. In yet another example, the cell 700 include an additional port having two or more pass-gate devices for additional data access, such as data reading or writing.

FIG. 8 illustrates a substrate 8001 having a plurality of gate elements 8002 and overlying multi-layer interconnect (MLI) 8004 which includes a plurality of metal layers and interposing vias (Via 0, M1, via 1, M2, via 2, M3, via 3, M4). The exemplary MLI 8004 may be used to implement any one of the above described embodiments for a memory device.

The gates such as gate 8002 may be used to form a transistor or portion thereof (including as illustrated in FIG. 7 above of the memory cell such as memory cell 700, discussed above) and/or gate elements 110, also discussed above. The gate 8002 may include a gate electrode and underlying gate dielectric. A source/drain region lies adjacent the gate 8002 forming the transistor. Contact level interconnects are disposed above the gate 8002 level and below the MLI 8004 and include conductive contacts to the substrate (active and/or isolation regions), to the gate, to the source/drain, and/or other suitable features. These contact level interconnects may include a butted contact (BTC), an extended contact, and a gate contact, and/or other suitable contact features including those illustrated by elements 112 and 114. This contact level may also be referred to a front-end-of-the-line (FEOL) contact. The contact level element may be tungsten, silicide, or other suitable conductive material.

The MLI 8004 illustrates Via0, M1, Via1, M2, Via2, M3, etc which may include features substantially similar to as discussed above. In some embodiments, one or more of the Via0, Via1, Via2 layers includes a rectangular shaped via as discussed above. In some further embodiments, one or more of the Via0, Via1, Via2 layers also include a circular shaped vias as discussed above.

Thus, provided in some embodiments is an optimized Vss node connection structure for a memory cell such as an SRAM device. In some embodiments, the optimized Vss node connection is provided by a rectangular shaped via. In some embodiments, other via components, may be circular/square shaped including, for example, those providing connections to the BL or BLB, Vdd node, WL, landing pads providing connections to these nodes, and/or other interconnections of the memory cell. In some embodiments, use of rectangular and circular/square vias provides for an optimized memory cell having increased density and speed—in other words, provides a high density and high speed memory cell in comparison with memory cells such, as memory cell 400.

Thus, in an embodiment provided is a memory device that includes an SRAM memory cell including a transistor, a Vss node component on a first metallization layer, and a via interfacing the first metallization layer and coupling the Vss node and the transistor. The via has a length and a width, the length at least 1.5 times that of the width.

In some embodiments, a memory device includes a pull-down transistor comprising a gate structure, a source and a drain. The memory device further includes an extended contact having a length at least three times a width interfacing the source. A first via is disposed above and interfaces the extended contact. The first via has a rectangular shape having a length at least 1.5 times a width. A first Vss landing pad disposed on the first metallization layer, the Vss landing pad interfaces the first via.

In some embodiments, a memory device includes two cross-coupled inverters and a first pass-gate device and a second pass-gate device coupled to a respective on of the two cross-coupled inverters. An extended contact is connected to a source node of a pull-down device of one of the two cross-coupled inverters. A first via is disposed over and interfacing the extended contact structure, the first via having a rectangular shape. A first Vss landing pad is disposed on a first metallization layer above and interfacing the first via. A second via is disposed over and interfacing the first Vss landing pad, wherein the second via having the rectangular shape.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a memory device comprising:
   forming transistor devices on including a first transistor having a source region on a substrate:
   forming an extended contact extending laterally from a shallow trench isolation feature to the source region of the first transistor;
   defining a first pattern associated with a first via, wherein the first pattern defines a rectangular shape;
   forming a first via according the first pattern, wherein the first via extends vertically upward from the extended contact, wherein the first via has the rectangular shape with a length and a width, the length at least 1.5 times that of the width, wherein the length and width are measured on a plane parallel a top surface of the substrate;
   forming on a first metallization layer a first conductive island above the first via;
   forming a second metallization layer above the first metallization layer, a second conductive island and a word line, wherein the second conductive island is connected to the first conductive island by a second via; and
   forming a third metallization layer, a Vss line coupled to the second conductive island by a third via.

2. The method of claim 1, further comprising:
   providing a layout, wherein the layout includes a memory cell having the first transistor as a pull-down transistor.

3. The method of claim 1, wherein the forming the extended contact includes depositing a conductive material directly on the source region of the first transistor.

4. The method of claim 1, wherein the forming the first via is performed after the forming the extended contact.

5. The method of claim 1, wherein the forming the first via includes depositing a layer of dielectric over the substrate;
   defining the first pattern associated with the first via in the layer of dielectric;
   etching the layer of dielectric to form a hole; and
   filing the hole with conductive material to form the first via.

6. The method of claim 5, wherein the first pattern includes a plurality of vias with non-uniform dimensions.

7. The method of claim 5, wherein the first pattern includes a third via with a circular via shape and a fourth via with a rectangular via shape.

8. A method of fabricating a memory device comprising:
   disposing a first transistor on a substrate, wherein the first transistor includes a gate structure, a source and a drain formed on a substrate;
   forming a contact layer over the substrate, wherein the contact layer includes an extended contact having a length at least three times a width and directly interfacing the source;
   forming a first via layer over the contact layer, wherein the first via layer includes a first via interfacing the extended contact, wherein the first via has a rectangular shape having a length at least 1.5 times a width, the length extending in a first direction parallel a top surface of the substrate and the width extending in a second direction parallel a top surface of the substrate, the second direction perpendicular the first direction;
   forming a first metallization layer (M1) over the first via layer, wherein M1 includes a first Vss landing pad, wherein the first Vss landing pad directly interfaces the first via;
   after forming M1, forming a second via layer over M1, wherein the second via layer includes a second via extending from the first Vss landing pad; and
   forming a second metallization layer (M2) over the second via layer, wherein M2 includes a second Vss landing pad coupled to the second via.

9. The method of claim 8, wherein the forming the contact layer includes:
   depositing a layer of dielectric on the substrate;
   defining a hole having a shape corresponding to the first via; and
   filling the hole with conductive material to form the first via.

10. The method of claim 9, wherein the layer of dielectric includes at least one of tetraethylorthosilicate (TEOS) oxide, un-doped silicate glass, borophosphosilicate glass (BPSG), fused silica glass (FSG), phosphosilicate glass (PSG), or boron doped silicon glass (BSG).

11. The method of claim 9, wherein the filling the hole with conductive material includes depositing tungsten.

12. The method of claim 9, wherein the forming the first via layer includes:
   patterning a dielectric layer to define a first hole in the dielectric layer associated with the first via and a second hold in the dielectric layer associated with the second via, wherein the second hole is has a substantially equal length and width, wherein the length extends in the first direction and the width extends in the second direction.

13. The method of claim 9, wherein the forming the first via layer further includes forming a second via, wherein the second via is patterned to form a substantially circular shape.

14. The method of claim 8, wherein the forming the first metallization layer and the forming the second metallization layer include depositing copper.

15. The method of claim 14, wherein the forming the contact layer includes depositing tungsten.

16. The method of claim 15, wherein the forming the first via layer includes depositing at least one of tungsten or copper.

17. A method of forming a memory device, comprising:
  providing a first transistor forming having a gate structure extending over a first fin and a second fin and a source node formed having a first portion on the first fin and a second portion on the second fin;
  forming an extended contact structure interfacing the source node of the first transistor by the extended contact structure interfacing the first portion and the second portion of the source node;
  forming a first via over and directly interfacing the extended contact structure, the first via having a rectangular shape defined by a hard mask layer used in forming the first via;
  forming a first Vss landing pad disposed on a first metallization layer above and directly interfacing the first via; and
  forming a second via disposed over and interfacing the first Vss landing pad, wherein the second via has the rectangular shape; and
  routing a word line (WL) disposed on a second metallization layer above and directly interfacing a top surface of the second via.

18. The method of claim 17, wherein during the forming the first via, a third via is formed having a circular shape.

19. The method of claim 17, wherein during the forming the second via, a fourth via is formed having a circular shape.

20. The method of claim 17, wherein the forming the first via includes defining a pattern in the hard mask layer corresponding to the rectangular shape over a dielectric layer disposed over the extended contact structure.

* * * * *